US007685455B2

(12) United States Patent
Nambu et al.

(10) Patent No.: US 7,685,455 B2
(45) Date of Patent: Mar. 23, 2010

(54) SEMICONDUCTOR INTEGRATED CIRCUIT WHICH GENERATES INTERNAL CLOCK SIGNAL FOR FETCHING INPUT DATA SYNCHRONOUSLY WITH THE INTERNAL CLOCK SIGNAL WITHOUT DECREASE OF TIMING MARGIN

(75) Inventors: Hiroaki Nambu, Sagamihara (JP); Masao Shinozaki, Higashimurayama (JP); Kazuo Kanetani, Akishima (JP); Hideto Kazama, Hamura (JP)

(73) Assignees: Renesas Technology Corp. (JP); Hitachi ULSI Systems Co., Ltd. (JP)

( * ) Notice: Subject to any disclaimer, the term of this patent is extended or adjusted under 35 U.S.C. 154(b) by 187 days.

(21) Appl. No.: 11/936,543

(22) Filed: Nov. 7, 2007

(65) Prior Publication Data
US 2008/0072095 A1 Mar. 20, 2008

Related U.S. Application Data

(63) Continuation of application No. 10/768,441, filed on Feb. 2, 2004, now Pat. No. 7,296,173.

(30) Foreign Application Priority Data
Mar. 20, 2003 (JP) ............................. 2003-077301

(51) Int. Cl.
*G06F 1/04* (2006.01)
(52) U.S. Cl. ..................... 713/400; 713/500; 713/600; 365/194; 327/116; 327/120
(58) Field of Classification Search .................. 713/400
See application file for complete search history.

(56) References Cited

U.S. PATENT DOCUMENTS

| 6,066,969 | A | 5/2000 | Kawasaki et al. |
| 6,181,174 | B1 | 1/2001 | Fujieda et al. |
| 6,182,234 | B1 | 1/2001 | Toda |
| 6,229,757 | B1 * | 5/2001 | Nagata et al. ............ 365/233.1 |
| 6,304,117 | B1 | 10/2001 | Yamazaki et al. |
| 6,380,774 | B2 | 4/2002 | Saeki |
| 6,522,182 | B2 | 2/2003 | Tomita et al. |

(Continued)

FOREIGN PATENT DOCUMENTS

JP  11-110062  4/1999

*Primary Examiner*—Nitin C Patel
(74) *Attorney, Agent, or Firm*—Antonelli, Terry, Stout & Kraus, LLP.

(57) ABSTRACT

A semiconductor integrated circuit is provided in which the timing margin for fetching data is prevented from being reduced even in the case where the duty ratio of a clock signal is different from 50%. The semiconductor integrated circuit includes: a clock input terminal for receiving a clock signal; a data input terminal for receiving a data signal; internal clock generating circuits for generating an internal clock signal which is switched at an intermediate timing between the i-th (i: an integer of 1 or larger) switch timing and the (i+1)th switch timing of the clock signal; and a latch circuit for latching the data signal synchronously with the internal clock signal. An internal clock signal which is switched at an intermediate timing between the i-th switch timing and the (i+1)th switch timing of the clock signal is generated, and the data signal is fetched synchronously with the internal clock signal.

5 Claims, 12 Drawing Sheets

U.S. PATENT DOCUMENTS

| | | |
|---|---|---|
| 6,529,993 B1 * | 3/2003 | Rogers et al. ............... 711/105 |
| 6,570,944 B2 | 5/2003 | Best et al. |
| 6,618,320 B2 * | 9/2003 | Hasegawa et al. ........ 365/233.1 |
| 6,642,760 B1 | 11/2003 | Alon et al. |
| 6,677,792 B2 | 1/2004 | Kwak |
| 6,691,214 B1 * | 2/2004 | Li et al. ...................... 711/167 |
| 6,721,232 B2 | 4/2004 | Kashiwazaki |
| 6,724,228 B2 | 4/2004 | Kashiwazaki |
| 6,807,125 B2 | 10/2004 | Coteus et al. |
| 6,941,484 B2 * | 9/2005 | To et al. ...................... 713/500 |
| 6,950,956 B2 * | 9/2005 | Zerbe et al. ................. 713/400 |
| 7,057,431 B2 | 6/2006 | Kwak |
| 2003/0031082 A1 * | 2/2003 | Sawada ....................... 365/233 |
| 2003/0147298 A1 * | 8/2003 | Ooishi et al. ................ 365/233 |

* cited by examiner

| No. | SA1 | SA2 | SA3 | SA4 | SA5 | SB1 | SB2 | SB3 | SB4 | SB5 |
|-----|-----|-----|-----|-----|-----|-----|-----|-----|-----|-----|
| 1 | ON | OFF | OFF | OFF | OFF | ON | OFF | OFF | OFF | OFF |
| 2 | OFF | ON | OFF | OFF | OFF | ON | ON | OFF | OFF | OFF |
| 3 | OFF | OFF | ON | OFF | OFF | ON | ON | ON | OFF | OFF |
| 4 | OFF | OFF | OFF | ON | OFF | ON | ON | ON | ON | OFF |
| 5 | OFF | OFF | OFF | OFF | ON | ON | ON | ON | ON | ON |

FIG. 11

"0": LOW LEVEL
"1": HIGH LEVEL
HZ: High-Z (HIGH IMPEDANCE)

| No. | THE NUMBER OF INVS | S0 | M0 | S1 | M1 | S2 | M2 | S3 | M3 |
|---|---|---|---|---|---|---|---|---|---|
| 1 | EVEN NUMBER | HZ | 1 | HZ | 1 | HZ | 1 | HZ | 1 |
| 2 | ODD NUMBER | 0 | HZ | HZ | 1 | HZ | 1 | HZ | 1 |
| 3 | EVEN NUMBER | HZ | 0 | 0 | HZ | HZ | 1 | HZ | 1 |
| 4 | ODD NUMBER | 1 | HZ | 0 | HZ | HZ | 1 | HZ | 1 |
| 5 | EVEN NUMBER | HZ | 1 | HZ | 0 | 0 | HZ | HZ | 1 |
| 6 | ODD NUMBER | 0 | HZ | HZ | 0 | 0 | HZ | HZ | 1 |
| 7 | EVEN NUMBER | HZ | 0 | 1 | HZ | 0 | HZ | HZ | 1 |
| 8 | ODD NUMBER | 1 | HZ | 1 | HZ | 0 | HZ | HZ | 1 |
| 9 | EVEN NUMBER | HZ | 1 | HZ | 1 | HZ | 0 | 0 | HZ |
| 10 | ODD NUMBER | 0 | HZ | HZ | 1 | HZ | 0 | 0 | HZ |
| 11 | EVEN NUMBER | HZ | 0 | 0 | HZ | HZ | 0 | 0 | HZ |
| 12 | ODD NUMBER | 1 | HZ | 0 | HZ | HZ | 0 | 0 | HZ |
| 13 | EVEN NUMBER | HZ | 1 | HZ | 0 | 1 | HZ | 0 | HZ |
| 14 | ODD NUMBER | 0 | HZ | HZ | 0 | 1 | HZ | 0 | HZ |
| 15 | EVEN NUMBER | HZ | 0 | 1 | HZ | 1 | HZ | 0 | HZ |
| 16 | ODD NUMBER | 1 | HZ | 1 | HZ | 1 | HZ | 0 | HZ |
| 17 | EVEN NUMBER | HZ | 1 | HZ | 1 | HZ | 1 | HZ | 0 |
| 18 | ODD NUMBER | 0 | HZ | HZ | 1 | HZ | 1 | HZ | 0 |
| 19 | EVEN NUMBER | HZ | 0 | 0 | HZ | HZ | 1 | HZ | 0 |
| 20 | ODD NUMBER | 1 | HZ | 0 | HZ | HZ | 1 | HZ | 0 |
| 21 | EVEN NUMBER | HZ | 1 | HZ | 0 | 0 | HZ | HZ | 0 |
| 22 | ODD NUMBER | 0 | HZ | HZ | 0 | 0 | HZ | HZ | 0 |
| 23 | EVEN NUMBER | HZ | 0 | 1 | HZ | 0 | HZ | HZ | 0 |
| 24 | ODD NUMBER | 1 | HZ | 1 | HZ | 0 | HZ | HZ | 0 |
| 25 | EVEN NUMBER | HZ | 1 | HZ | 1 | HZ | 0 | 1 | HZ |
| 26 | ODD NUMBER | 0 | HZ | HZ | 1 | HZ | 0 | 1 | HZ |
| 27 | EVEN NUMBER | HZ | 0 | 0 | HZ | HZ | 0 | 1 | HZ |
| 28 | ODD NUMBER | 1 | HZ | 0 | HZ | HZ | 0 | 1 | HZ |
| 29 | EVEN NUMBER | HZ | 1 | HZ | 0 | 1 | HZ | 1 | HZ |
| 30 | ODD NUMBER | 0 | HZ | HZ | 0 | 1 | HZ | 1 | HZ |
| 31 | EVEN NUMBER | HZ | 0 | 1 | HZ | 1 | HZ | 1 | HZ |
| 32 | ODD NUMBER | 1 | HZ | 1 | HZ | 1 | HZ | 1 | HZ |

SEMICONDUCTOR INTEGRATED CIRCUIT WHICH GENERATES INTERNAL CLOCK SIGNAL FOR FETCHING INPUT DATA SYNCHRONOUSLY WITH THE INTERNAL CLOCK SIGNAL WITHOUT DECREASE OF TIMING MARGIN

CROSS REFERENCE TO RELATED APPLICATIONS

This application is a continuation of U.S. application Ser. No. 10/768,441, filed Feb. 2, 2004 (now U.S. Pat. No. 7,296, 173), and which application claims priority from Japanese Patent Application 2003-077301, filed Mar. 20, 2003, the entire contents of which are hereby incorporated by reference into this application.

BACKGROUND OF THE INVENTION

The present invention relates to a semiconductor integrated circuit; and, more particularly, the invention relates to a technique that is effective when used for generating an internal clock signal, in the case of fetching input data synchronously with an internal clock signal that is generated from an external clock signal.

In a semiconductor integrated circuit including a clock synchronous type memory, in order to fetch data in the memory with reliability, data has to be held only for a predetermined period, and data output control has to be performed. For operation, an internal clock signal having a predetermined phase relation with an external clock has to be generated.

A DDR (Double Data Rate) memory system for transferring data twice in one clock cycle so as to increase the speed of inputting/outputting data of the semiconductor integrated circuit, and an EA (Edge Aligned) data output system, in which the switch phase of a clock signal and that of a data signal are matched in order to enlarge the data window, have been proposed. In such a method, data supplied to an LSI has to be fetched synchronously with an internal clock signal which has a phase that is different from the phase of the clock by almost 90 or 270 degrees (refer to, for example, the following Patent Document).

[Patent Document]
Japanese Unexamined Patent Publication No. Hei 11 (1999)-110062

SUMMARY OF THE INVENTION

FIG. 16 shows the timings of a clock signal and a data signal in the case of using both the DDR memory system and the EA data output system. In the diagram, CK denotes a clock signal, DI denotes a data signal, and tc indicates a cycle time. In the example, the duty ratio (th/tc) of the clock signal CK is 50% (that is, th=tl). Since the DDR memory system is employed, the data signal DI is switched twice in one clock cycle. Since the EA output system is employed, the switching phase of the clock signal CK and that of the data signal DI coincide with each other.

When the technique employed in the above-referenced Patent Document is applied, an internal clock signal CKIT having a phase different from that of the clock signal CK by 90 degrees and an internal clock signal CKIB having a phase different from that of the clock signal CK by 270 degrees are generated. That is, tkh=0.25×tc and tkl=0.25×tc. The internal clock signals CKIT and CKIB are switched at intermediate timings of the switch timings of the data signal DI (that is, tkh=tch and tkl=tcl, where tch=0.5×th and tcl=0.5×tl). Therefore, when the data signal DI is fetched by a latch circuit DIRG, which operates synchronously with the internal clock signal CKIT or CKIB, the data signal DI can be latched with a sufficient timing margin.

However, when the same technique is applied in the case where the duty ratio (th/tc) of the clock signal CK is different from 50%, a sufficient margin cannot be assured.

FIG. 17 shows an example where the duty ratio is 70%. When the technique of the aforementioned Patent Document is applied, in a manner similar to the case of FIG. 16, tkh=0.25×tc and tkl=0.25×tc. On the other hand, the intermediate timings of the switch timings of the data signal DI are tch=0.35×tc and tcl=0.15×tc. Therefore, in the case of latching the data signal DI by the latch circuit DIRG which operates synchronously with the internal clock signal CKIT or CKIB, the timing margin becomes smaller only by Δtch=tch−tkh=0.1×tc or Δtcl=(0.7×tc+tcl)−(0.5×tc+tkl)=0.1×tc.

An object of the present invention is to prevent the timing margin, at the time of latching the data signal synchronously with the clock signal, from being decreased in the case where the duty ratio of the clock signal CK is different from 50%.

The above and other objects and novel features of the present invention will become apparent from the description in this specification and from the attached drawings.

An outline of representative aspects of the invention disclosed in this specification will be briefly described as follows.

A semiconductor integrated circuit includes: a clock input terminal for receiving a clock signal and a data input terminal for receiving a data signal; an internal clock generating circuit for generating an internal clock signal which is switched at an intermediate timing between the i-th (i: an integer of 1 or larger) switch timing and the (i+1)th switch timing of the clock signal input to the clock input terminal; and a latch circuit for latching the data signal input to the data input terminal synchronously with the internal clock signal.

According to this aspect of the invention, the data signal is fetched synchronously with the internal clock signal, which is switched at an intermediate timing between the i-th switch timing and the (i+1)th switch timing of the clock signal input to the clock input terminal. Thus, even in the case where the duty ratio of the clock signal is different from 50%, the timing margin for fetching data can be prevented from being reduced.

The internal clock generating circuit includes: first means for holding a delay amount corresponding to a time which is half of the difference between the (i−j)th switch timing and the (i+1+j)th a: an integer of 0 or larger) switch timing of the clock signal (an amount corresponding to switching of (2j+1) times); and second means for generating the internal clock by delaying the clock signal only by the length of the held delay time.

The internal clock generating circuit is constructed by first and second frequency dividers, a phase comparator, a variable delay circuit, and a delay control circuit, and it includes: a first frequency divider for generating a first frequency divided signal synchronized with the (i−j)th switch timing of the clock signal; a second frequency divider for generating a second frequency divided signal synchronized with the (i+1+j)th switch timing of the clock signal; a phase comparator for comparing the phase of the first frequency divided signal and the phase of the second frequency divided signal; and a delay control circuit for controlling the variable delay circuit so as to produce a delay time corresponding to a time which is equal to half of the phase difference.

The semiconductor integrated circuit according to the invention further includes a clock input buffer for receiving a clock signal which is input to the clock input terminal. The clock input buffer generates a first clock signal and a second clock signal at a level complementary to the first clock signal. When the first clock signal is input to the first frequency divider, the second clock signal is input to the second frequency divider. When the first clock signal is input to the second frequency divider, the second clock signal is input to the first frequency divider.

When a semiconductor integrated circuit includes: a clock input terminal; a data input terminal; an internal clock generating circuit for generating an internal clock signal from a clock signal which is input to the clock input terminal; and a latch circuit for latching a data signal input to the data input terminal synchronously with the internal clock signal, the internal clock generating circuit includes: a first variable delay circuit for receiving the clock signal and outputting the internal clock signal; a second variable delay circuit for delaying the clock signal or an inversion signal of the clock signal; a third variable delay circuit for delaying an output signal of the second variable delay circuit; a first frequency divider for dividing the frequency of an output signal of the third variable delay circuit; a second frequency divider for dividing the frequency of the clock signal or the inversion signal of the clock signal; a phase comparator for comparing the phase of a first frequency divided signal that is output from the first frequency divider with the phase of a second frequency divided signal that is output from the second frequency divider; and a delay control circuit for outputting a delay control signal for controlling the first, second, and third variable delay circuits on the basis of an output signal of the phase comparator. The first, second, and third variable delay circuits have the same configuration. The first frequency divider generates a first frequency divided signal synchronized with the (i−j)th switch timing of the clock signal (where i denotes an integer of 1 or larger and j denotes an integer of 0 or larger), the second frequency divider generates a second frequency divided signal synchronized with the (i+1+j)th switch timing of the clock signal, the phase comparator compares the phase of the first frequency divided signal with the phase of the second frequency divided signal to obtain a phase difference, and the delay control circuit controls the delay times of the first, second, and third variable delay circuits so that the phase difference becomes zero.

Each of the first and second frequency dividers is constructed by connecting a plurality of latch circuits in series, and, by setting initial states of the latch circuits, the value of j is set.

The initial state of the latch circuit can be set by a fuse signal or an external input signal.

A dummy delay circuit having a delay time which is twice as long as the time obtained by subtracting the delay time of a signal transmitted from the data input terminal to the latch circuit from the sum of the delay time of a signal transmitted from the clock input terminal to the first variable delay circuit and the delay time of a signal transmitted from the first variable delay circuit to the latch circuit, is disposed at some point of a signal path extending from the clock input terminal to the first frequency divider.

When a semiconductor integrated circuit includes: a clock input terminal; a data input terminal; an internal clock generating circuit for generating an internal clock signal from a clock signal which is input to the clock input terminal; and a latch circuit for latching a data signal input to the data input terminal synchronously with the internal clock signal, the internal clock generating circuit can be constructed by including: a variable delay circuit for receiving the clock signal and outputting the internal clock signal; a dummy variable delay circuit for delaying an output signal of the variable delay circuit; a first frequency divider for dividing the frequency of an output signal of the dummy variable delay circuit; a second frequency divider for dividing the frequency of the clock signal or the inversion signal of the clock signal; a phase comparator for comparing the phase of a first frequency divided signal output from the first frequency divider with the phase of a second frequency divided signal output from the second frequency divider; and a delay control circuit for outputting a delay control signal for controlling the variable delay circuit and the dummy variable delay circuit on the basis of an output signal of the phase comparator. The first frequency divider generates a first frequency divided signal synchronized with the (i−j)th switch timing of the clock signal (where i denotes an integer of 1 or larger and j denotes an integer of 0 or larger), the second frequency divider generates a second frequency divided signal that is synchronized with the (i+1+j)th switch timing of the clock signal, the phase comparator compares the phase of the first frequency divided signal with the phase of the second frequency divided signal to obtain a phase difference, and the delay control circuit controls the delay times of the variable delay circuit and the dummy variable delay circuit so that the phase difference becomes zero.

The semiconductor integrated circuit may further include a memory cell array in which a plurality of memory cells are arranged in an array, and write data to any of the memory cells can be transmitted as a data signal to the latch circuit.

BRIEF DESCRIPTION OF THE DRAWINGS

FIG. 11 is a table illustrating an example of the initial setting of each latch circuit in FIG. 10.

DETAILED DESCRIPTION OF PREFERRED
EMBODIMENTS OF THE INVENTION

Figure 15:
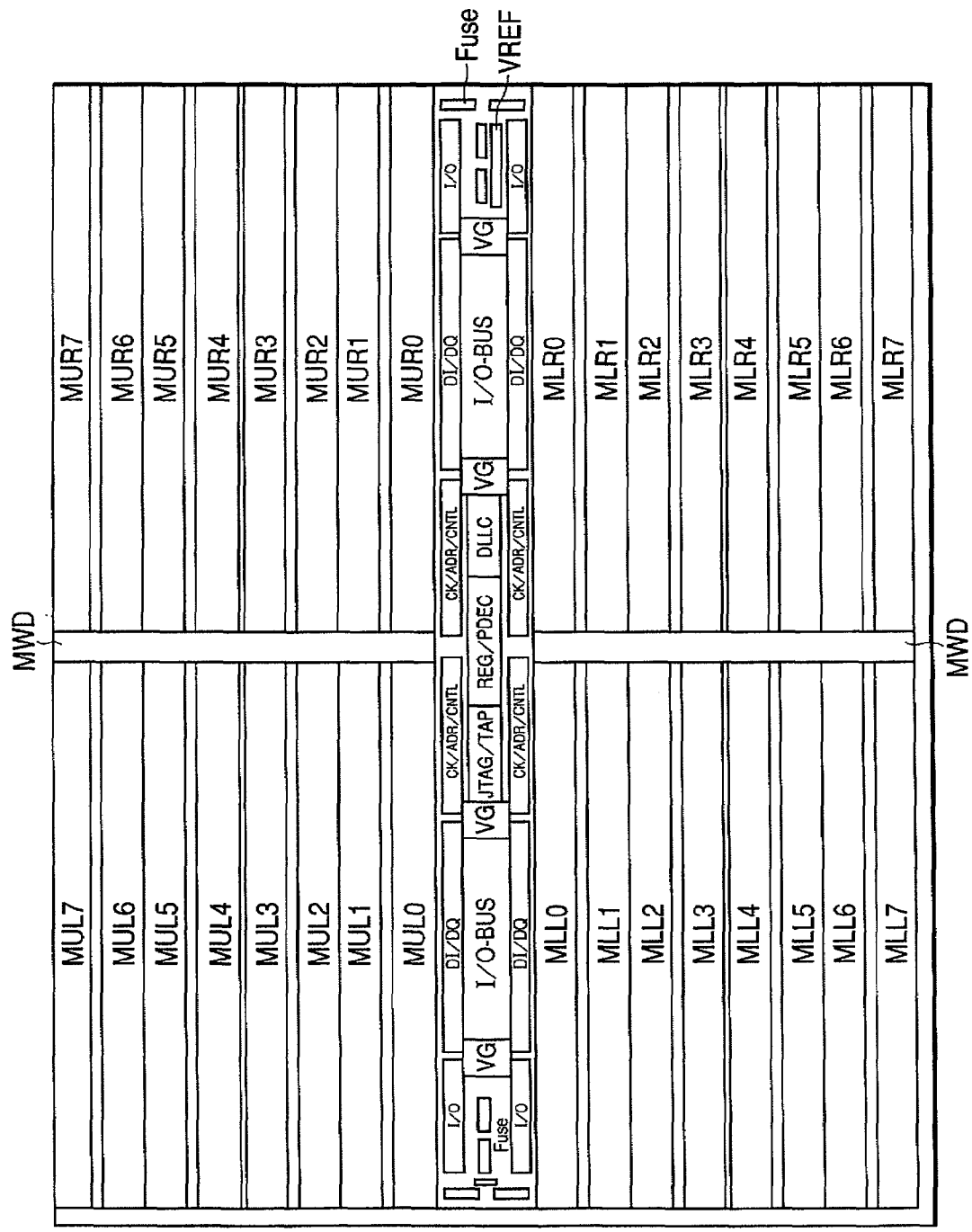
FIG. 15 is a layout diagram showing another example of the configuration of the main portion of the static RAM.
Figure 16:
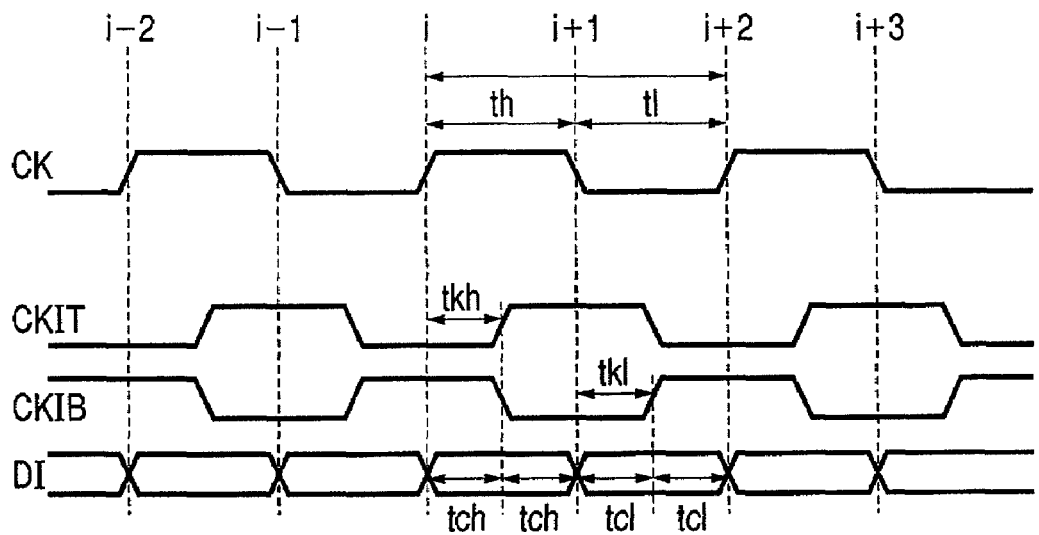
FIG. 16 is a waveform chart showing an example of the timings of a clock signal and a data signal.
Figure 17:
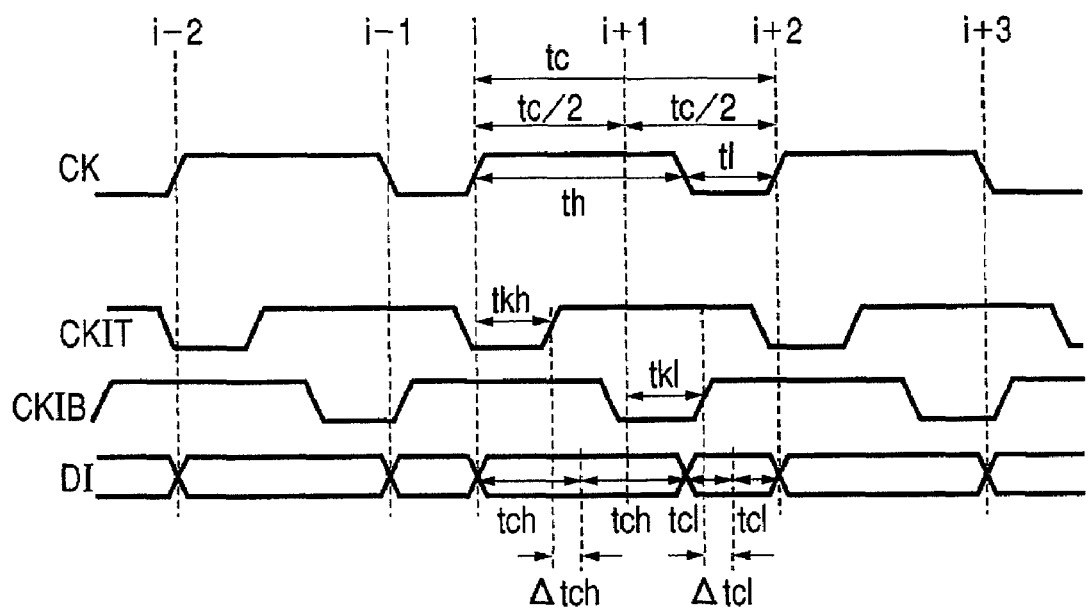
FIG. 17 is a waveform chart showing another example of the timings of the clock signal and the data signal.

FIG. 15 shows the configuration of a static type RAM (or a static RAM), representing an example of a semiconductor integrated circuit according to the invention.

The static RAM shown in FIG. 15 is of a clock synchronous type in which both the DDR memory system and the EA data output system are used. Although the present invention is not so limited, using a known semiconductor integrated circuit fabricating technique, the static RAM is formed on a single semiconductor substrate, such as a single crystal silicon substrate.

In FIG. 15, MUL0 to MUL7, MUR0 to MUR7, MLL0 to MLL7, and MLR0 to MLR7 are memory cell arrays, in each of which a plurality of static memory cells are arranged in an array shape, and MWD denotes a main word driver. CK/ADR/CNTL denotes a various inputs circuit providing a clock signal, an address signal, and a memory control signal, respectively, DI/DQ denotes a data input/output circuit, and I/O indicates an input/output circuit of a mode switch signal, a test signal, a DC signal, and the like. In the example, a center pad type is shown. The various inputs circuit CK/ADR/CNTL, the data input/output circuit DI/DQ, and the input/output circuit I/O are also positioned in the center of the chip. REG/PDEC denotes a predecoder or the like, DLLC denotes a clock synchronizing circuit, JTAG/TAP denotes a test circuit, VG indicates an internal power source voltage generating circuit, and FUSE indicates a fuse circuit. The fuse circuit FUSE is used, for example, to repair a defect in a memory array. VREF represents a reference voltage generating circuit for generating a reference voltage for fetching an input signal.

Figure 1:
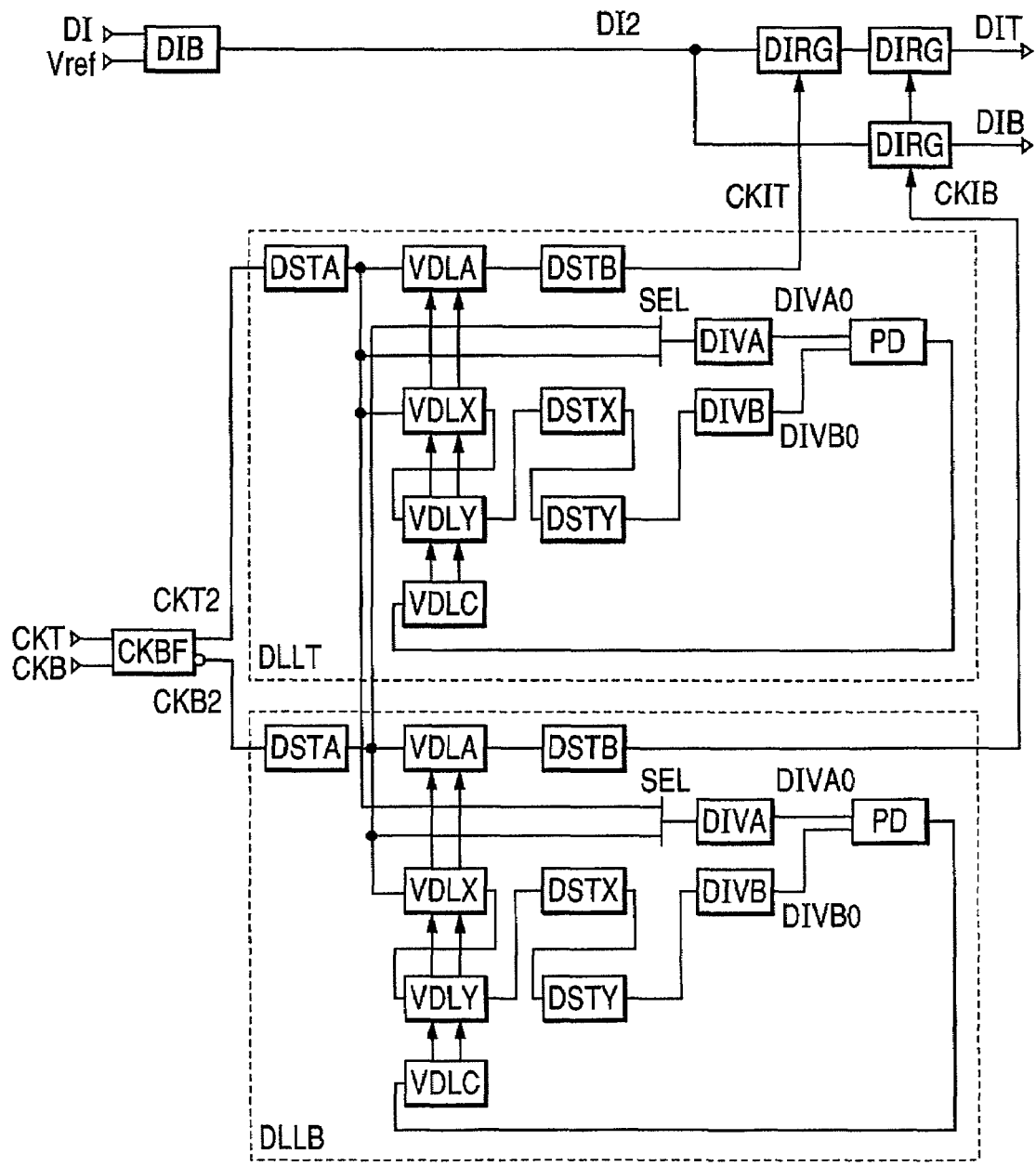
FIG. 1 is a block diagram showing an example of the configuration of a main portion of a static type RAM (or a static RAM), representing an example of a semiconductor integrated circuit according to the invention.

FIG. 1 shows an example of the configuration of a main part of the static RAM.

DI denotes a data signal. This data signal is data to be written into the memory cell array. Vref denotes a reference level signal which is at an almost intermediate level between the low level and the high level of the data signal DI. CKT and CKB denote clock signals at a complementary level, and CKIT and CKIB indicate internal clock signals.

DIB denotes a DI input buffer, DIRG denotes a latch circuit for latching an output D12 of the DI input buffer DIB synchronously with the internal clock signal CKIT or CKIB, and CKBF denotes a CK input buffer. The circuit is designed so that the delay time of the DI input buffer DIB and that of the CK input buffer CKBF are almost the same. DLLT denotes a delay locked loop for receiving an output CKT2 of the CK input buffer CKBF and for generating the internal clock signal CKIT. DLLB denotes a delay locked loop for receiving an inversion signal CKB2 of the clock signal CKT2 and for generating the internal clock signal CKIB. DSTA indicates a first CK distributing circuit and is constructed by, for example, an inverter and the like. VDLA denotes a variable delay circuit. DSTB denotes a second CK distributing circuit and is constructed by, for example, an inverter and the like. DIVA and DIVB denote frequency dividers, PD indicates a phase comparator, VDLX and VDLY indicate dummy variable delay circuits having the same configuration and which are designed to have almost the same delay time, DSTX denotes a first dummy CK distributing circuit designed to have a delay time about twice as long as that of the first CK distributing circuit DSTA, DSTY denotes a second dummy CK distributing circuit designed to have a delay time about twice as long as that of the second CK distributing circuit DSTB, and VDLC represents a delay control circuit.

The DI input buffer DIB and the latch circuit DIRG are included in the data input/output circuit DI/DQ, and the CK input buffer CKBF is included in the various inputs circuit CK/ADR/CNTL. The variable delay circuit VDLA, the frequency dividers DIVA and DIVB, the phase comparator PD, the dummy variable delay circuits VDLX and VDLY, and the delay control circuit VDLC are included in the clock synchronizing circuit DLLC. The first CK distributing circuit DSTA is disposed in/around the various inputs circuit CK/ADR/CNTL or the clock synchronizing circuit DLLC, and the second CK distributing circuit DSTB is disposed either in the clock synchronizing circuit DLLC or between the clock synchronizing circuit DLLC and the data input/output circuit DI/DQ. The first dummy CK distributing circuit DSTX is disposed in/around the various inputs circuit CK/ADR/CNT or the clock synchronizing circuit DLLC so as to simulate the delay time of the first CK distributing circuit. The second dummy CK distributing circuit DSTY is disposed in the clock synchronizing circuit DLLC or between the clock synchronizing circuit DLLC and the data input/output circuit DI/DQ so as to simulate the delay time of the second CK distributing circuit.

Since by design the delay time of the DI input buffer DIB and that of the CK input buffer CKBF are almost the same, the same phase relation between the data signal DI and the clock signal CKT (CKB) is provided as it is to the data signal D12 and the clock signal CKT2 (CKB2). The operation of the delay locked loop DLLT to which the clock signal CKT2 is input will be described hereinbelow.

The frequency divider DIVB is designed so as to generate a frequency divided signal DIVBO that is synchronized with the (i−j)th switch timing of the clock signal CKT2 (where i denotes an integer of 1 or larger and j denotes an integer of 0 or larger). The frequency divider DIVA is designed so as to generate a frequency divided signal DIVAO synchronized with the (i+1+j)th switch timing of the clock signal CKT2. The phase comparator PD compares the phase of the frequency divided signal DIVBO and that of the frequency divided signal DIVAO. The comparison result is transmitted to the delay control circuit VDLC. The delay control circuit VDLC controls the delay time of the variable delay circuits VDLA, VDLX, and VDLY so that the phase difference becomes zero on the basis of the transmitted phase comparison result. Since the difference between (i−j) and (i+1+j) is (2j+1), which is an odd number, as will be described later, it is desirable that one of the frequency dividers DIVB and DIVA generates a frequency divided signal by using the inversion signal CKB2 of the clock signal CKT2. As seen in FIG. 1, by disposing a selector SEL before DIVA, the clock signal CKB2 can be input selectively. That is, the selector SEL can selectively transmit an output signal of the distributing circuit DSTA in the delay locked loop DLLT and an output signal of the distributing circuit DSTA in the delay locked loop DLLB to the frequency divider DIVA.

Figure 2:
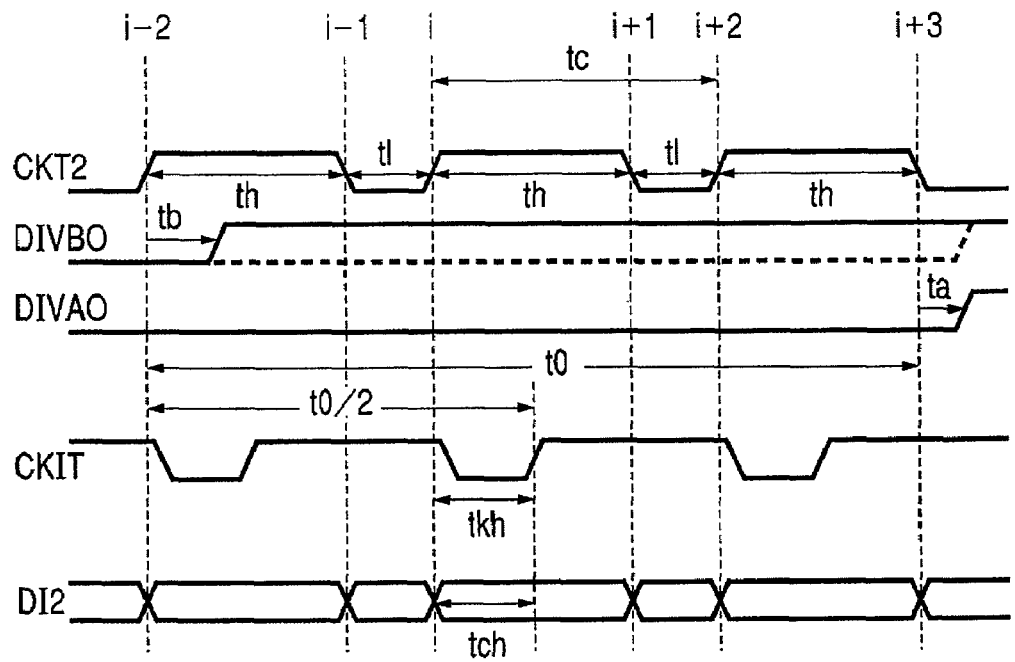
FIG. 2 is a timing diagram showing an example of timings of signals of an embodiment of the invention.

FIG. 2 shows the operation timings in the case where j=2.

In this case, the frequency divider DIVB generates the frequency divided signal DIVBO that is synchronized with the (i−2)th switch timing of the clock signal CKT2, and the frequency divider DIVA generates the frequency divided signal DIVAO that is synchronized with the (i+3)th switch timing of the clock signal CKT2. When the delay time of the distributing circuit DSTA is tpd(DSTA), the delay time of the frequency divider DIVA is tpd(DIVA), the delay time of the frequency divider DIVB is tpd(DIVB), the same delay time of the variable delay circuits VDLX and VDLY is tpd(VDLX), the delay time of the distributing circuit DSTX is tpd(DSTX), and the delay time of the distributing circuit DSTY is tpd (DSTY), the following equations are satisfied.

$$ta = tpd(DSTA) + tpd(DIVA)$$

$$tb = tpd(DSTA) + tpd(DIVB) + 2 \times tpd(VDLX) + tpd(DSTX) + tpd(DSTY) \quad (1)$$

When it is assumed that the delay time tpd(DIVA) of the frequency divider DIVA and the delay time tpd(DIVB) of the frequency divider DIVB are equal to each other, the following equation is satisfied.

$$tpd(DIVA) = tpd(DIVB) \quad (2)$$

As a result, the equation (1) can be rewritten as follows.

$$tb = tpd(DSTA) + tpd(DIVA) + 2 \times tpd(VDLX) + tpd(DSTX) + tpd(DSTY)$$

The delay control circuit VDLC controls the delay times of the variable delay circuits VDLA, VDLX, and VDLY so that the phase difference between the frequency divided signals DIVBO and DIVAO becomes zero.

Consequently, the following equations are satisfied.

$$tb = t0 + ta$$

$$t0 = 2 \times tpd(VDLX) + tpd(DSTX) + tpd(DSTY)$$

When the delay time of the variable delay circuit VDLA is tpd(VDLA) and the delay time of the distributing circuit DSTB is tpd(DSTB), the following equations are satisfied.

$$tpd(VDLA) = tpd(VDLX) \quad (3)$$

$$tpd(DSTA) = 0.5 \times tpd(DSTX) \quad (4)$$

$$tpd(DSTB) = 0.5 \times tpd(DSTY) \quad (5)$$

Therefore, the following equations are satisfied.

$$t0 = 2 \times tpd(VDLA) + 2 \times tpd(DSTA) + 2 \times tpd(DSTB)$$

$$tpd(VDLA) + tpd(DSTA) + tpd(DSTB) = 0.5 \times t0$$

As a result, as shown in FIG. 2, the internal clock signal CKIT is switched at a timing delayed from CKT2 by 0.5×t0. Consideration is to be given to the fact that the following equation is always satisfied irrespective of the duty ratio of CKT2 (that is, CKT).

$$tkh = 0.5 \times t1 - tc = 0.5 \times th = tch \quad (6)$$

Therefore, when the duty ratio of CKT is different from 50%, the timing margin can be prevented from being decreased when DI2 is latched by the latch circuit DIRG, which operates synchronously with the internal clock signal CKIT.

In order to satisfy the equation (6) with high precision, the equations (3) to (5) have to be satisfied with high precision. For this reason, it is desirable to use the dummy variable delay circuits VDLX and VDLY that are designed to have a delay time which is almost the same as that of VDLA, the dummy CK distributing circuit DSTX that is designed to have a delay time which is about twice as long as the delay time of DSTA, and the dummy CK distributing circuit DSTY that is designed to have a delay time which is about twice as long as the delay time of DSTB.

Figure 3:
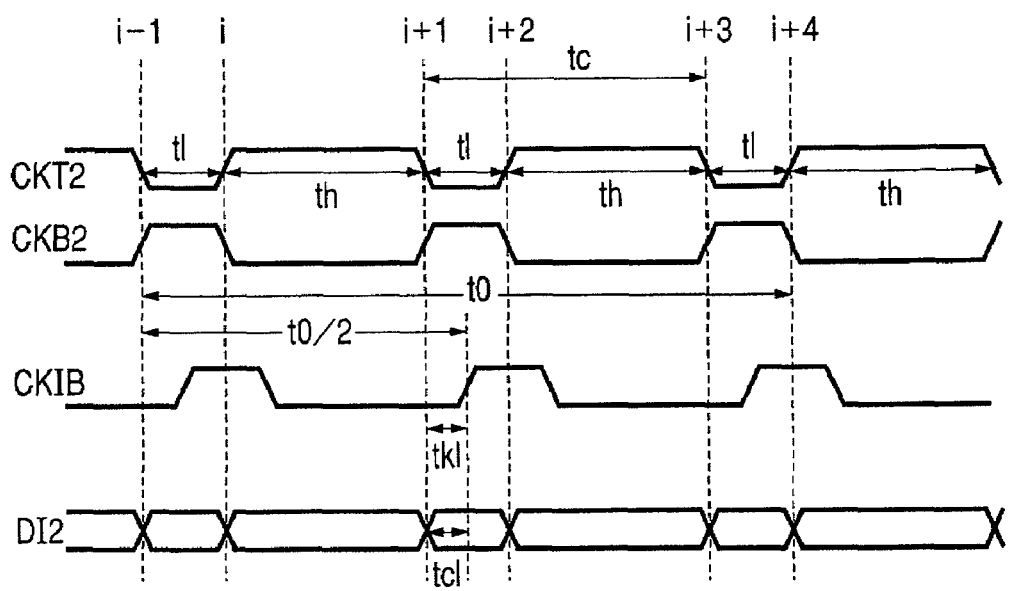
FIG. 3 is a timing diagram showing another example of timings of signals of the embodiment of the invention.

The delay locked loop DLLT has been described above. The delay locked loop DLLB operates similarly when constructed in the same way. Specifically, in the delay locked loop DLLB, when the frequency divider DIVB generates the frequency divided signal DIVBO that is synchronized with the (i−1)th switch timing of the clock signal CKT2 and the frequency divider DIVA generates the frequency divided signal DIVAO that is synchronized with the (i+4)th switch timing of CKT, as shown in FIG. 3, the equation (7) is satisfied. Consequently, like DLLT, at the time of latching D12 by the latch circuit DIRG, which operates synchronously with CKIB by the latch circuit DIRG, the timing margin can be prevented from being decreased.

$$tkl = tcl \quad (7)$$

Figure 4:
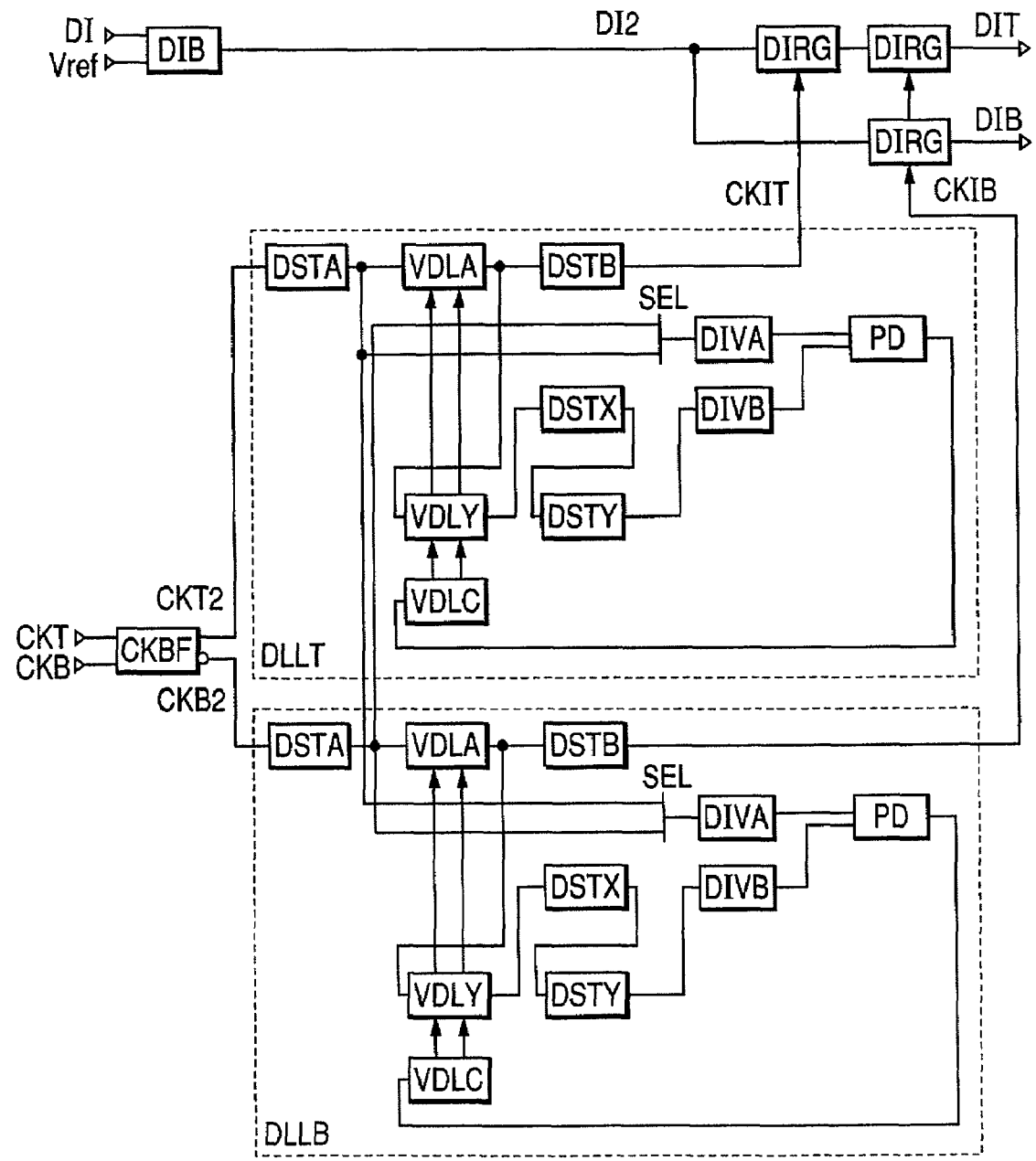
FIG. 4 is a block diagram showing another example of the configuration of a main portion of a static RAM, representing an example of the semiconductor integrated circuit according to the invention.

FIG. 4 shows another example of the configuration of the main part of the static RAM.

The circuit shown in FIG. 4 is different from that shown in FIG. 1 with respect to the fact that the function of the variable delay circuit VDLX is performed by the variable delay circuit VDLA, and the variable delay circuit VDLX is omitted. With this change, the area of the circuit occupying the chip can be reduced only by the amount of the omitted variable delay circuit VDLX. Also, when the variable delay circuit VDLX is replaced by the variable delay circuit VDLA, the equation (3) is satisfied with higher precision. As a result, the equations (6) and (7) are satisfied with higher precision. Thus, at the time of latching the data signal DI by the latch circuit DIRG, which operates synchronously with the internal clock signal CKIT or CKIB, a reduction in the timing margin can be prevented with higher reliability.

Figure 5:
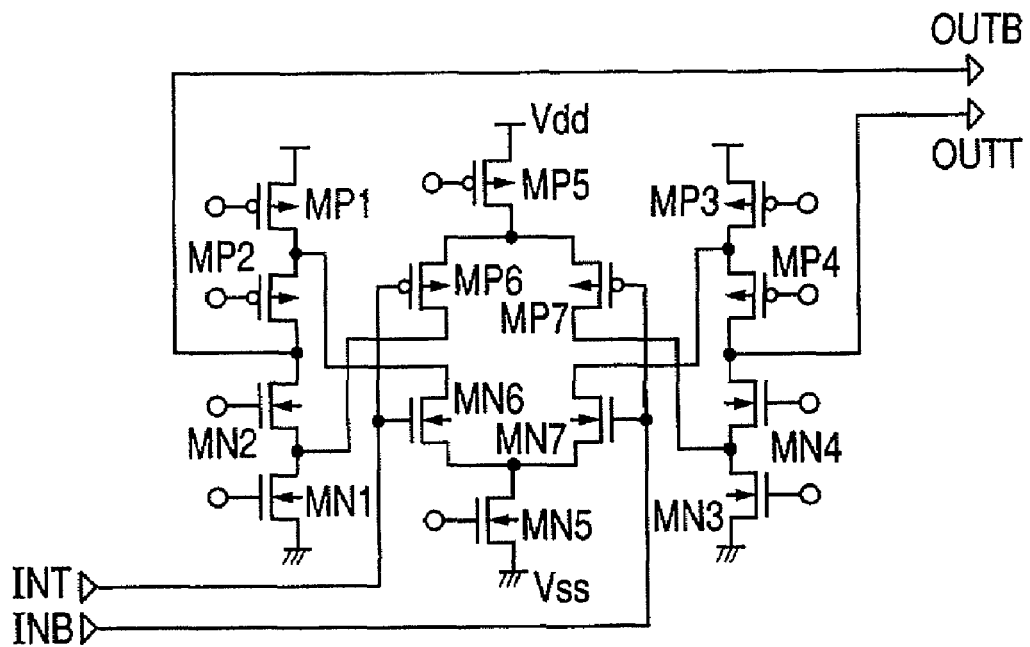
FIG. 5 is a schematic circuit diagram showing an example of the configuration of a DI input buffer DIB and a CK input buffer CKBF included in the static RAM.

FIG. 5 shows an example of the configuration of the DI input buffer DIB and the CK input buffer CKBF in FIG. 1. Vss denotes a low potential side power source, Vdd denotes a high potential side power source, MP1 to MP7 denote p-channel type MOS transistors, and MN1 to MN7 denote n-channel type MOS transistors. To the gate electrodes of the MOS transistors MP1 to MP5 and MN1 to MN5, a predetermined bias voltage is applied. The MOS transistors MP6 and MP7 are differentially coupled, and the MOS transistors MN6 and MN7 are differentially coupled. The MOS transistors MP1, MP2, MN2, and MN1 are connected in series. The drain electrode of the MOS transistor MN6 is coupled to the series connection node of the MOS transistors MP1 and MP2, and the drain electrode of the MOS transistor MP6 is coupled to the series connection node of the MOS transistors MN2 and MN1. The MOS transistors MP3, MP4, MN4, and MN3 are connected in series. The drain electrode of the MOS transistor MN7 is connected to the series connection node of the MOS transistors MP3 and MP4, and the drain electrode of the MOS transistor MP7 is connected to the series connection node of the MOS transistors MN4 and MN3.

In the circuit, to input terminals INT and INB, a differential signal may be input. Alternately, a reference level may be input to one of the input terminals and a signal may be input to the other input terminal. In correspondence with the input signals, output signals are output from output terminals OUTB and OUTT. Specifically, when the potential level of INT is higher than that of INB, MN6 and MP7 are turned on and MP6 and MN7 are turned off. Consequently, the source potentials of MP2 and MN2 drop, MP2 is turned off, MN2 is turned on, and the level of OUTB becomes low. The source potentials of MP4 and MN4 increase, MP4 is turned on, MN4 is turned off, and the level of OUTT becomes high.

Figure 6:
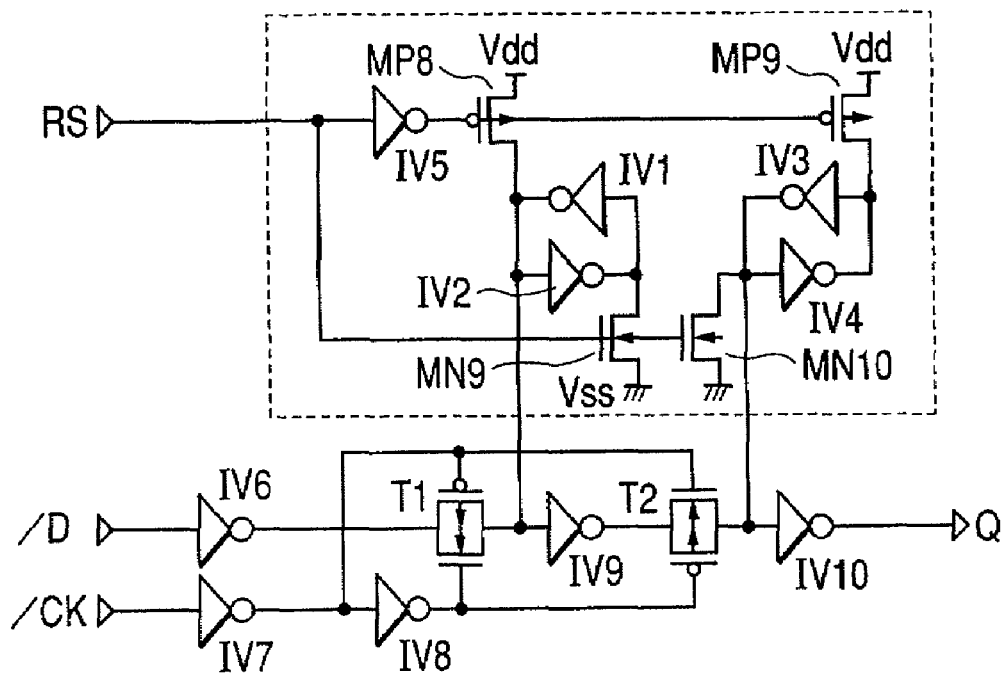
FIG. 6 is a schematic circuit diagram showing an example of the configuration of a latch circuit included in the static RAM.

FIG. 6 shows an example of the configuration of the latch circuit DIRG in FIG. 1.

The circuit is a slave-master type latch circuit for latching input data /D synchronously with a clock signal /CK, and it is constructed by connecting inverters IV1 to IV10, p-channel type MOS transistors MP8 and MP9, n-channel type MOS transistors MN9 and MN10, and transfer gates T1 and T2. A slave is constructed by the transfer gate T1 and the inverters IV1 and IV2, and a master is constructed by the transfer gate T2 and the inverters IV3 and IV4. By connecting the inverters IV1 and IV2 in parallel, a storage is formed in the slave. By connecting the inverters IV3 and IV4 in parallel, a storage is formed in the master. RS denotes a signal for resetting the latch circuit, and Q denotes an output signal of the latch circuit.

Figure 7:
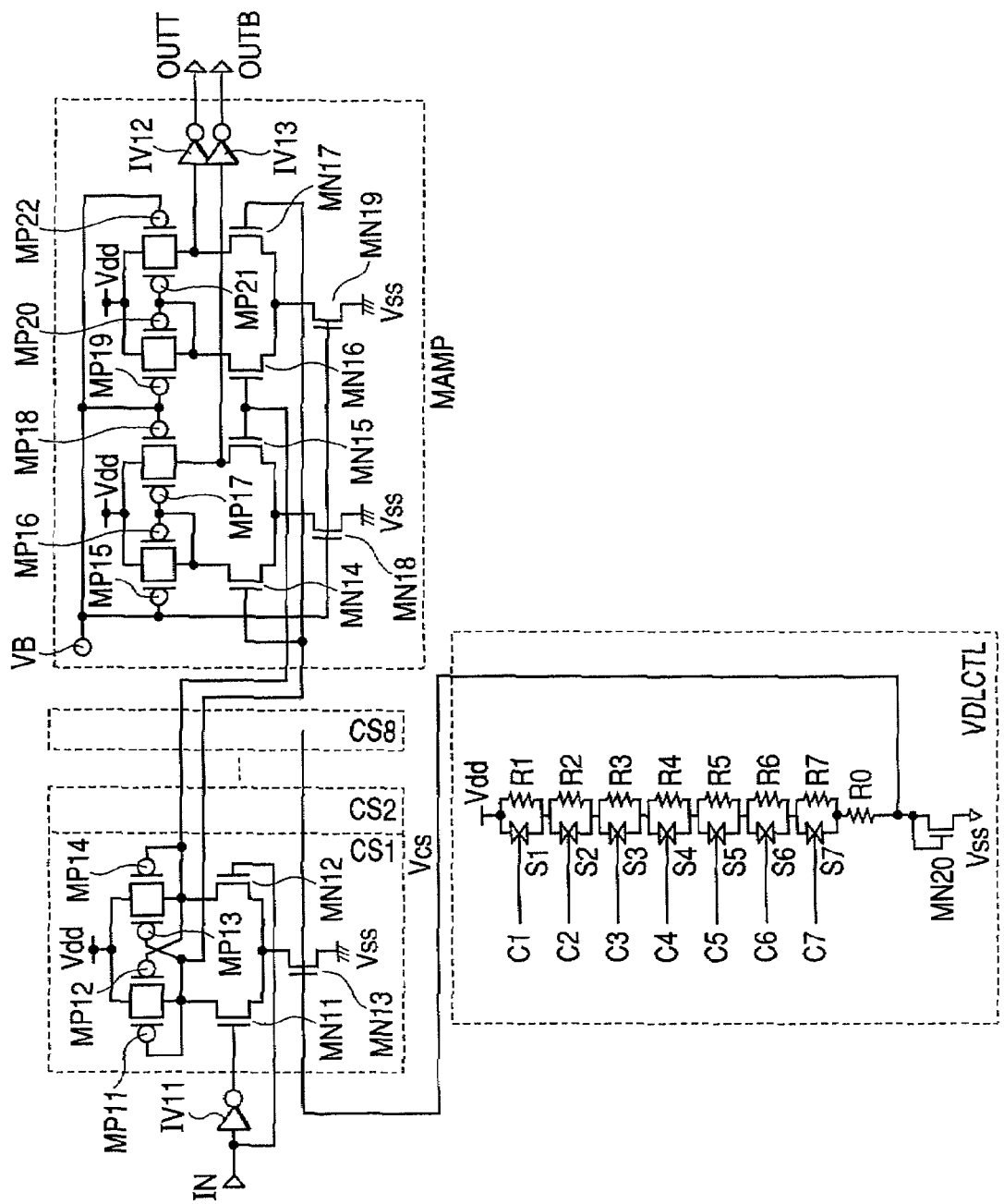
FIG. 7 is a schematic circuit diagram showing an example of the configuration of a variable delay circuit and a dummy variable delay circuit included in the static RAM.

FIG. 7 shows an example of the configuration of the variable delay circuit VDLA and the dummy variable delay circuits VDLX and VDLY in FIG. 1.

In FIG. 7, CS1 to CS8 denote differential amplifiers, MAMP denotes a main amplifier, IN indicates an input signal, and OUTT and OUTB indicate output signals of a complementary level.

The plurality of differential amplifiers CS1 to CS8 have the same configuration, and FIG. 7 representatively shows an example of the configuration of the differential amplifier CS1. Although the invention is not so limited, the differential amplifier CS1 is constructed by connecting p-channel type MOS transistors MP11, MP12, MP13, and MP14 and n-channel type MOS transistors MN11, MN12, and MN13. The source electrodes of the MOS transistors MN11 and MN12 are connected to the low potential side power source Vss via the MOS transistor MN13, thereby obtaining a differential connection. By connecting the MOS transistors MP11 and MP12 in parallel and connecting the MOS transistors MP13 and MP14 in parallel, the load of the differential MOS transistors MN11 and MN12 is formed. The drain electrode of the MOS transistor MN11 is coupled to the high potential side power source Vdd via the MOS transistors MP11 and MP12. The drain electrode of the MOS transistor MN12 is connected to the high potential side power source Vdd via the MOS transistors MP13 and MP14. A signal input from the input terminal IN is transmitted directly to the gate electrode of the MOS transistor MN12 and to the gate electrode of the MOS transistor MN11 via the inverter IV11.

Although the invention is not so limited, the main amplifier MAMP is constructed by connecting p-channel type MOS transistors MP15 to MP22, n-channel type MOS transistors MN14 to MN19, and inverters IV12 and IV13. The source electrodes of the MOS transistors MN14 and MN15 are connected to the low potential side power source Vss via the MOS transistor MN18. By connecting the MOS transistors MP15 and MP16 in parallel and connecting the MOS transistors MP17 and MP18 in parallel, the load of the MOS transistors MN14 and MN15 is formed. The drain electrode of the MOS transistor MN14 is coupled to the high potential side power source Vdd via the MOS transistors MP15 and MP16. The drain electrode of the MOS transistor MN15 is connected to the high potential side power source Vdd via the MOS transistors MP17 and MP18. The source electrodes of the MOS transistors MN16 and MN17 are coupled to the low potential side power source Vss via the MOS transistor MN19. By connecting the MOS transistors MP19 and MP20 in parallel and connecting the MOS transistors MP21 and MP22 in parallel, the load of the MOS transistors MN16 and MN17 is created. The drain electrode of the MOS transistor MN16 is coupled to the high potential side power source Vdd via the MOS transistors MP19 and MP20. The drain electrode of the MOS transistor MN17 is coupled to the high potential side power source Vdd via the MOS transistors MP21 and MP22. To the gate electrodes of the MOS transistors MN14 and MN17 and the gate electrodes of the MOS transistors MN15 and MN16, a differential output signal is transmitted from the plurality of differential amplifiers CS1 to CS8. The drain electrode of the MOS transistor MN17 is coupled to the output terminal OUTT via the inverter IV12 for signal output. The drain electrode of the MOS transistor MN15 is coupled to the output terminal OUTB via the inverter IV13 for signal output. To the gate electrodes of the MOS transistors MP15, MP18, MP19, MP22, MN18, and MN19, a predetermined bias voltage VB is supplied.

To the gate electrode of the MOS transistor MN13 in the plurality of differential amplifiers CS1 to CS8, a control voltage Vcs is supplied. The control voltage Vcs is generated by a control circuit VDLCTL. By controlling the control voltage Vcs, the signal delay time in the differential amplifiers CS1 to CS8 is controlled, and the delay time, from the time the input signal IN is input until the time the output signal OUTT (or OUTB) is obtained, can be changed.

Although the invention is not so limited, the control circuit VDLCTL is constructed by an n-channel type MOS transistor MN20, resistors R0 to R7, and switches S1 to S7. The ratio of the resistors R1, R2, R3, R4, R5, R6, and R7 is set to be about 1:2:4:8:16:32:64. Therefore, by inputting a binary code to signals C1 to C7 for controlling on/off operation of the switches S1 to S7, a current which is inversely proportional to a decimal number corresponding to the binary code is passed to the MOS transistor MN20. The MOS transistors MN13 and MN20 have a common gate voltage (Vcs), thereby forming a current mirror circuit. Since it is considered that the delay time of the differential amplifiers CS1 to CS8 is inversely proportional to the current flowing in the MOS transistor MN13, the delay time of the differential amplifiers CS1 to CS8 changes in proportion to the decimal number corresponding to the binary code. In short, in the embodiment, the delay time can be changed in 128 ways (of the 7th power of 2).

Figure 8:
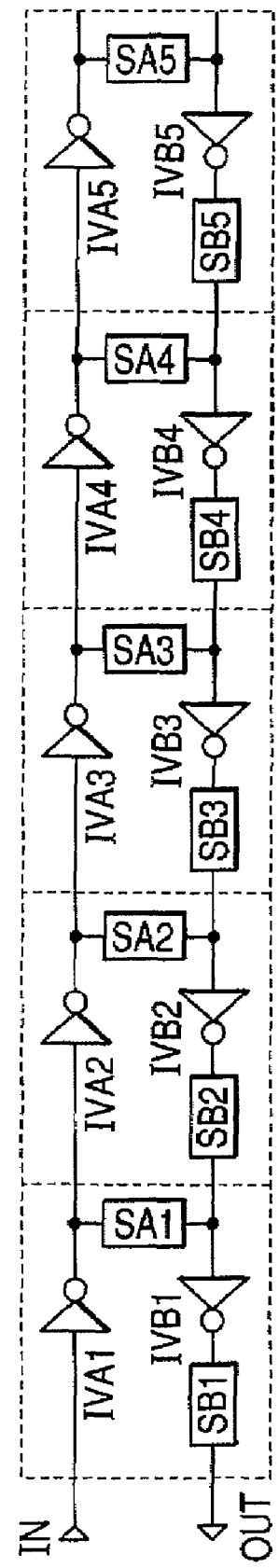
FIG. 8 is a schematic circuit diagram showing another example of the configuration of the variable delay circuit and the dummy variable delay circuit included in the static RAM.

FIG. 8 shows another example of the configuration of the variable delay circuit VDLA and the dummy variable delay circuits VDLX and VDLY in FIG. 1.

In FIG. 8, IVA1 to IVA5 and IVB1 to IVB5 denote inverters, and SA1 to SA5 and SB1 to SB5 indicate switches that are capable of opening/closing paths. IN denotes an input terminal and OUT denotes an output terminal. By controlling the ON/OFF operation of the switches, like shown in lines No. 1 to No. 5 in FIG. 9, the delay time, from the time the input signal IN is supplied until the time the output signal OUT is obtained, can be changed in 5 ways. For example, when the switches are controlled as shown in line No. 1 in FIG. 9, the input signal IN is transmitted through the inverter IVA1, switch SA1, inverter IVB1, and switch SB1, and the output signal OUT is obtained. When the switches are controlled as shown in line No. 2, the input signal IN passes through the inverters IVA1 and IVA2, switch SA2, inverter IVB2, switch SB2, inverter IVB1, and switch SB1, and the output signal OUT is obtained. Therefore, the delay time of the signal increases in the case of line No. 2 by the amount corresponding to the transmission through the inverters IVA2 and IVB2 and the switch SB2.

Figures 9, 10:
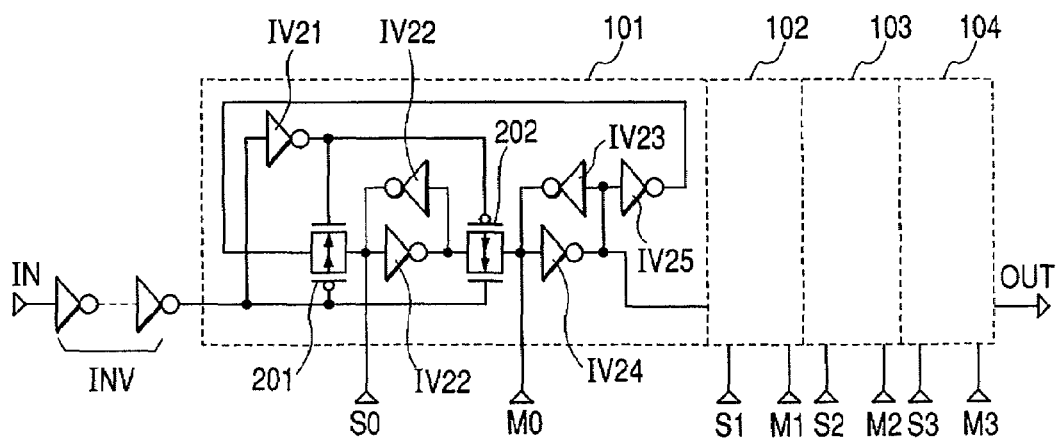
FIG. 9 is a table illustrating an example of the switch control used in the latch circuit of FIG. 6.
FIG. 10 is a schematic circuit diagram showing an example of the configuration of a frequency divider included in the static RAM.

FIG. 10 shows an example of the configuration of the frequency dividers DIVA and DIVB in FIG. 1. IN denotes an input signal and OUT indicates a frequency divided signal output. In the example, by connecting four slave-master type latch circuits 101, 102, 103, and 104 in series, a 16 frequency divider ($2^4$ frequency divider) is constructed. The latch circuits 101, 102, 103, and 104 have the same configuration. The latch circuit 101, as one example of the latch circuits, is constructed by connecting inverters IV21, IV22, IV23, IV24, and IV25 and transfer gates 201 and 202. The inverters IV21 and IV22 are connected in a loop shape and the inverters IV23 and IV 24 are connected in a loop shape, thereby forming holding parts for holding the signals. Signals are stored in the signal holding parts via the transfer gates 201 and 202.

In this circuit, by setting the number of inverters forming an input inverter group INV and setting the levels of initial setting signals S0 to S3 and M0 to M3 of the latch circuits 101 to 104, like shown in lines Nos. 1 to 32 in FIG. 11, a frequency divided signal that is synchronized with an arbitrary switch timing of the input signal can be generated. In FIG. 11, "0" denotes that the signal level is low, "1" denotes that the signal level is high, and "HZ" indicates that the node has a high impedance. For example, by setting initial setting levels of S0 to S3 and M0 to M3, as shown in line No. 1 in FIG. 11, and setting the number of input inverters INV to an even number, the frequency divider generates a frequency divided signal that is synchronized with the first switch timing of the input signal.

Figure 12:
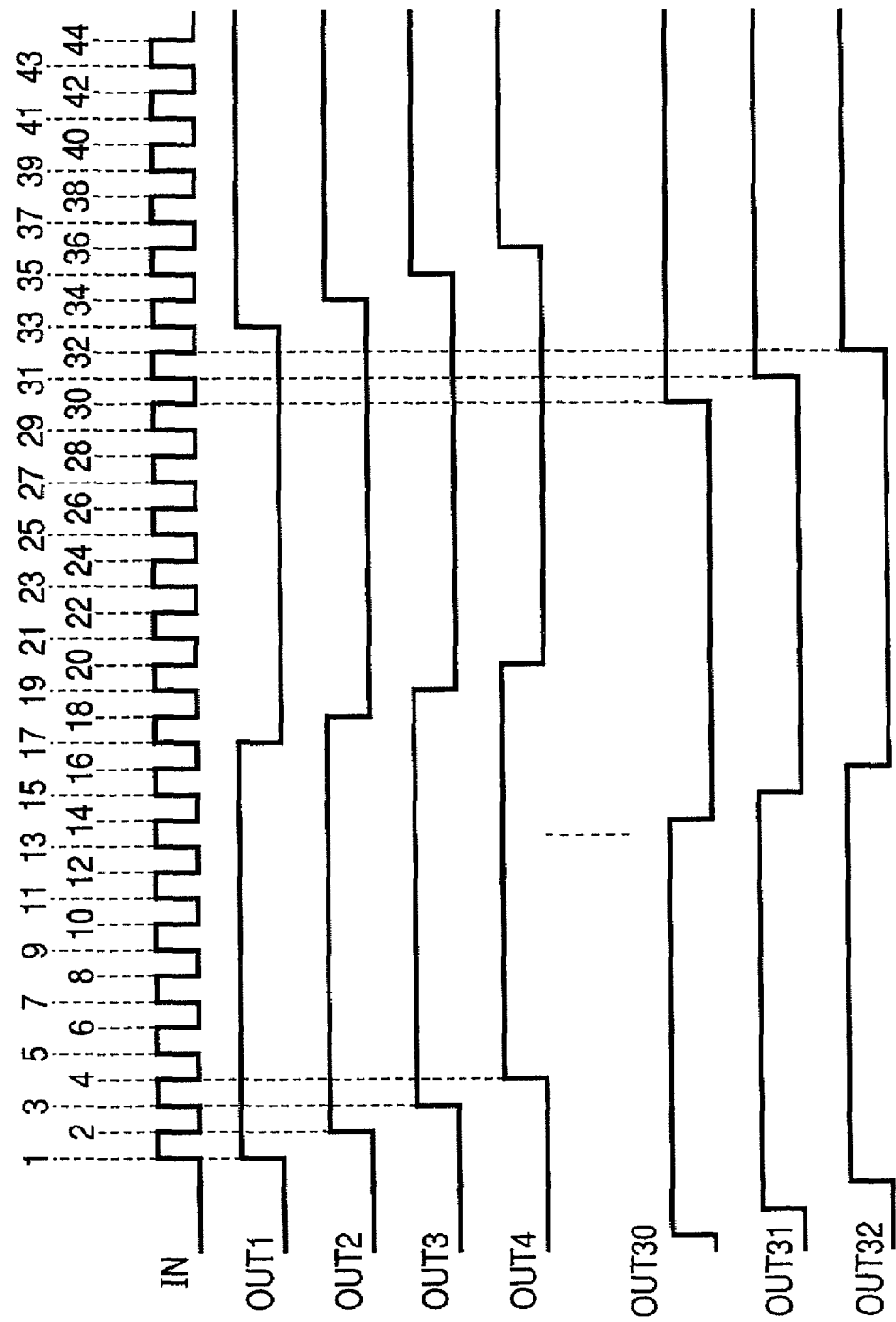
FIG. 12 is a waveform chart showing an example of the timings of an input signal and a frequency divided signal output by the latch circuit in FIG. 10.

FIG. 12 shows an example of the timings of the input signal and the frequency divided signal output. A frequency divided signal output corresponding to line No. 1 in FIG. 11 is OUT1. When the initial setting levels of S0 to S3 and M0 to M3 are set as shown in line No. 2 in FIG. 11 and the number of input inverters INV is set to an odd number, the frequency divider outputs a frequency divided signal that is synchronized with the second switch timing of the input signal, that is, a frequency divided signal indicated by OUT2 in FIG. 12. Similarly, when the initial setting levels of S0 to S3 and M0 to M3 are set as shown in line No. 32 in FIG. 11 and the number of input inverters INV is set to an odd number, the frequency divider outputs a frequency divided signal that is synchronized with the 32nd switch timing of the input signal, that is, a frequency divided signal indicated by OUT32 in FIG. 12.

Therefore, each of the frequency dividers DIVA and DIVB is constructed by connecting a plurality of latch circuits in series, and the initial states of the latch circuits are set, thereby enabling the value of j to be arbitrarily set.

When the initial state is set by a signal determined by a fuse or an external input signal, by turning the fuse on/off or changing the level of an external input signal, the value of j can be arbitrarily set.

Whether the number of input inverters INV of the frequency divider is set to an odd number or an even number is determined according to whether the frequency divided signal is synchronized with an odd-numbered switch timing or an even-numbered switch timing of an input signal. As described with reference to FIG. 1, when the frequency divider DIVB generates a frequency divided signal that is synchronized with the (i−j)th switch timing of an input clock and the frequency divider DIVA generates a frequency divided signal that is synchronized with the (i+1+j)th switch timing of the input clock, the difference between (i−j) and (i+1+j) is (2j+1), which is an odd number. Consequently, when one of the frequency dividers DIVB and DIVA synchronizes with an odd-numbered switch timing of an input signal, the other frequency divider synchronizes with an even-numbered switch timing of the input signal. Therefore, the number of input inverters INV of DIVB and that of DIVA cannot be made to coincide with each other. Specifically, the delay time of DIVB and that of DIVA are different from each other only by a delay time of an amount corresponding to at least one inverter stage, so that the equation (2) is not satisfied with precision.

To solve the above-mentioned problem, taking into consideration the fact that the input inverter INV is used for inverting the polarity of an input signal, it is sufficient to make one of the frequency dividers DIVB and DIVA generate a frequency divided signal by using the inversion signal CKB2 of CKT2. In FIG. 1, therefore, by disposing the selector SEL before DIVA, CKB2 can be input. In such a manner, the number of input inverters INV of DIVB and that of DIVA can be made to coincide with each other, the equation (2) is satisfied with higher precision, and, as a result, the equations (6) and (7) are also satisfied with higher precision. Therefore, at the time of latching DI by the latch circuit DIRG, which operates synchronously with the internal clock signal CKIT or CKIB, the timing margin can be prevented from being decreased with higher reliability.

For example, by properly setting the initial state of the frequency divider DIVA, the frequency divider DIVA can generate a frequency divided signal that is synchronized with the (i+j)th switch timing of the input clock. In this case, the phase of the internal clock is set to 0 or 180 degrees. Therefore, when the initial state is set by a fuse signal or external input signal, by turning the fuse on/off the fuse or changing the level of an external input signal, the phase of an internal clock can be freely set to 0, 90, 180, and 270 degrees.

Figure 13:
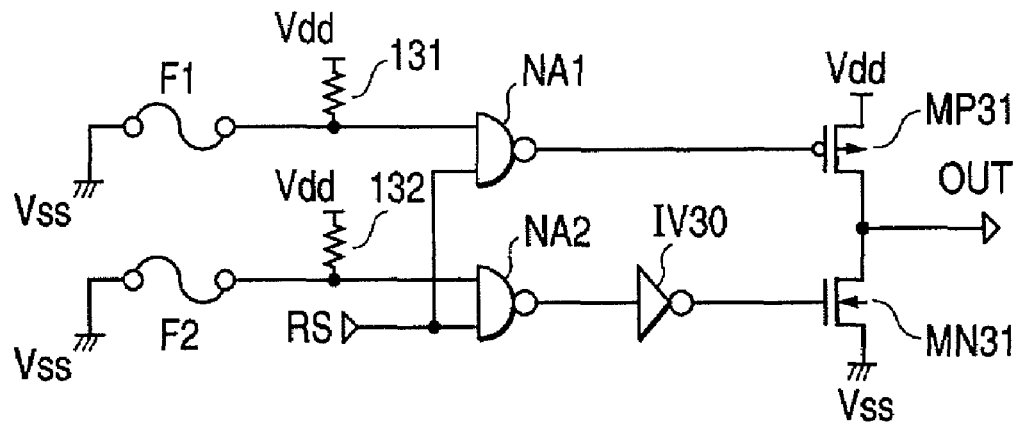
FIG. 13 is a schematic circuit diagram showing an example of the configuration of a circuit for generating an initial setting signal illustrated in FIG. 12.

FIG. 13 shows an example of the configuration of an initial setting circuit for generating initial setting signals S0 to S3 of the latch circuits forming the frequency divider illustrated in FIG. 10. An initial setting circuit for generating initial setting signals M0 to M3 can also employ the same configuration.

Although the invention is not so limited, the initial setting circuit shown in FIG. 13 is constructed by connecting fuses F1 and F2, pull-up resistors 131 and 132, NAND gates NA1 and NA2, an inverter IV30, a p-channel type MOS transistor MP31, and an n-channel type MOS transistor MN31. Depending on whether the fuses F1 and F2 are disconnected or not, the logic level of one of the input terminals in the NAND gates NA1 and NA2 is determined. An output signal of the NAND gate NA1 is transmitted to the MOS transistor MP31 in a post stage. An output signal of the NAND gate NA2 is transmitted to the MOS transistor MN31 in a post stage via the inverter IV30. The MOS transistors MP31 and MN31 are connected in series, and an output signal OUT is obtained from the series connection node. The output signal OUT corresponds to, for example, the initial setting signal S0 of FIG. 10. In the normal state, the reset signal RS in FIG. 13 is set to the low level. At this time, the output signal OUT has "HZ" (high impedance) and does not exert any influence on the operation of the latch circuit. On the other hand, when the reset signal is set to the high level at the time of initial setting, according to the on/off state of the fuses F1 and F2, the state of the output signal OUT changes. For example, in the case where the fuse F1 is on and the fuse F2 is off, when the reset signal is set to the high level, the output signal OUT becomes the low level. In the case where the fuse F1 is off and the fuse F2 is on, by setting the reset signal to the high level, the output signal OUT becomes the high level. In the case where both of the fuses F1 and F2 are ON, when the reset signal is set to the high level, the output signal OUT remains at HZ.

Figure 14:
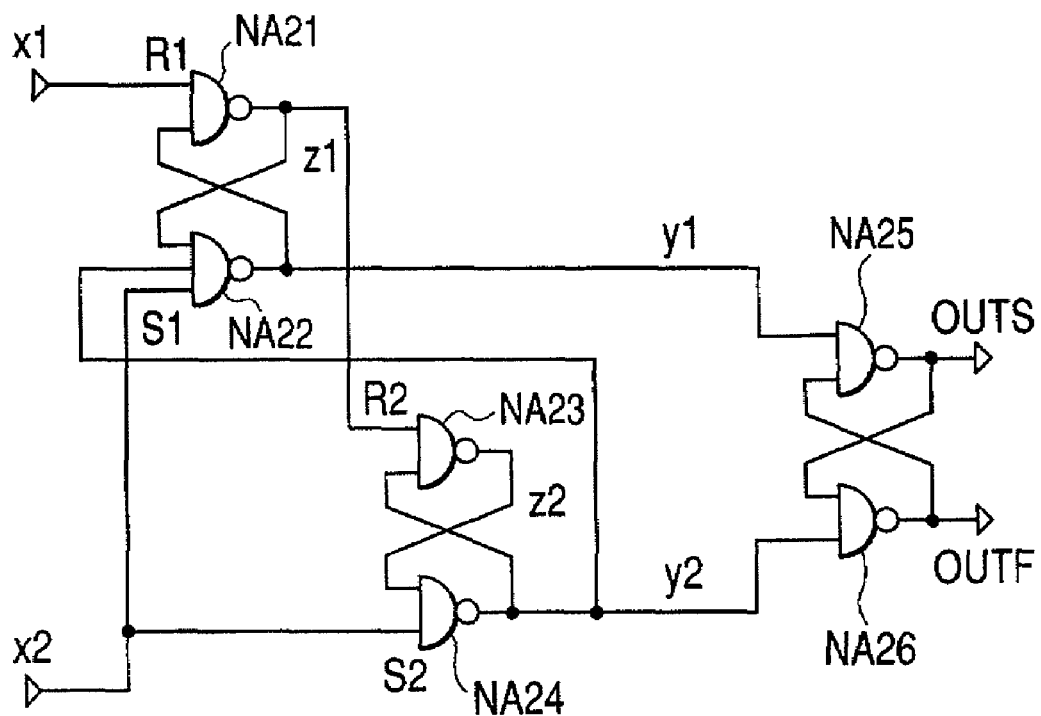
FIG. 14 is a schematic circuit diagram showing an example of the configuration of a phase comparator included in the static RAM.

FIG. 14 shows an example of the configuration of the phase comparator PD in FIG. 1. Although the invention is not so limited, the phase comparator PD shown in FIG. 14 is constructed by connecting NAND gates NA21 to NA26. x1 and x2 denote input signals and OUTS and OUTF indicate output signals. If x1 is at the high level when the signal x2 goes high, the circuit determines that the phase of x1 advances more than x2, sets the output signal OUTF to the high level and sets the output signal OUTS to the low level. If x1 is at the low level when x2 goes high, the circuit determines that the phase of x1 is behind that of x2, sets the output signal OUTS to the high level, and sets the output signal OUTF to the low level.

According to the invention, the following actions and effects can be obtained.

(1) By latching the data signal synchronously with the internal clock signal, which is switched at an intermediate timing between the i-th switch timing and the (i+1)th switch timing of a clock signal, even in the case where the duty ratio of the clock signal is different from 50%, a sufficient timing margin can be assured for latching data.

(2) By the action and effect (1), in the static RAM, data to be written into a memory cell array can be accurately fetched. Thus, the reliability of the static RAM can be improved.

Although the invention achieved by the inventors herein has been specifically set forth above, obviously, the invention is not limited to the embodiment as described, but can be variously changed without departing from the gist of the invention.

(3) As shown in FIG. 4, the function of the variable delay circuit VDLX is performed by the variable delay circuit VDLA, and the variable delay circuit VDLX is omitted, thereby enabling the area of the circuit occupying the chip to be reduced by the amount of the omitted variable delay circuit VDLX. When the variable delay circuit VDLX is replaced with the variable delay circuit VDLA, the equation (3) is satisfied with higher precision. As a result, the equations (6) and (7) are satisfied with higher precision. Thus, at the time the data signal DI is latched by the latch circuit DIRG, which operates synchronously with the internal clock signal CKIT or CKIB, reduction in the timing margin can be prevented with higher reliability.

The case in which the invention achieved by the inventors herein has been applied to a static RAM as an example of the utilization of the invention has been mainly described. The invention, however, is not limited to such an application, but can be widely applied to various semiconductor integrated circuits of a clock synchronous type.

The invention can be applied on condition that data is fetched synchronously with at least a clock signal.

The effect obtained by representative aspects of the invention disclosed in this specification will be briefly described as follows.

By latching the data signal synchronously with the internal clock signal, which is switched at an intermediate timing between the i-th switch timing and the (i+1)th switch timing of a clock signal, even in the case where the duty ratio of the clock signal is different from 50%, the timing margin for fetching data can be prevented from being reduced.

What we claim is:

1. A semiconductor integrated circuit comprising:
    a clock input terminal inputted with a clock signal which repeats a cycle having a first level, a second level, and two edges;
    a data input terminal inputted with a data signal;
    a first internal clock generating circuit for generating a first internal clock signal which changes a signal in a mid-period between a (n+i−j)th edge of said clock signal and a (n+i+j+1)th edge of said clock signal (where i denotes an integer of 1 or larger, j denotes an integer of 0 or larger and n denotes an integer of i+j+2 or larger; and
    a first latch circuit for latching said data signal input to said data input terminal according to said first internal clock signal,
    wherein said (n+i−j)th edge is an edge of changing from said first level to said second level, and
    wherein said (n+i+j1)th edge is an edge of changing from said second level to said first level.

2. The semiconductor integrated circuit according to claim 1, further comprising:
    a second internal clock generating circuit for generating a second internal clock signal which changes a signal in a mid-period between a (n+i−j+1)th edge of said clock signal and a (n+i+j2)th edge of said clock signal; and
    a second latch circuit for latching said data signal input to said data input terminal according to said second internal clock signal,
    wherein said (n+i−j+1)th edge is an edge of changing from said second level to said first level, and
    wherein said (n+i+j2)th edge is an edge of changing from said first level to said second level.

3. The semiconductor integrated circuit according to claim 1, further comprising:
    a memory cell array in which a plurality of memory cells are arranged in an array,
    wherein said memory cell can be written based on said data signal of said first and second latch circuits.

4. The semiconductor integrated circuit according to claim 2, further comprising:
    a plurality of static memory cells arranged in an array,
    wherein said plurality of static memory cells can be written based on said data signal of said first and second latch circuit.

5. The semiconductor integrated circuit according to claim 4,
    wherein said static memory cells are formed on a single semiconductor substrate.

* * * * *